(12) United States Patent
Yamamoto

(10) Patent No.: US 9,551,750 B2
(45) Date of Patent: Jan. 24, 2017

(54) MONITORING SYSTEM AND VEHICLE

(71) Applicant: TOYOTA JIDOSHA KABUSHIKI KAISHA, Toyota-shi (JP)

(72) Inventor: Hiroyoshi Yamamoto, Nagoya (JP)

(73) Assignee: TOYOTA JIDOSHA KABUSHIKI KAISHA, Toyota-Shi (JP)

(*) Notice: Subject to any disclaimer, the term of this patent is extended or adjusted under 35 U.S.C. 154(b) by 130 days.

(21) Appl. No.: 14/367,400

(22) PCT Filed: Dec. 21, 2012

(86) PCT No.: PCT/JP2012/008181
§ 371 (c)(1),
(2) Date: Jun. 20, 2014

(87) PCT Pub. No.: WO2013/094214
PCT Pub. Date: Jun. 27, 2013

(65) Prior Publication Data
US 2014/0333315 A1  Nov. 13, 2014

(30) Foreign Application Priority Data
Dec. 21, 2011  (JP) .................. 2011-279687

(51) Int. Cl.
*G01N 27/416* (2006.01)
*G01R 31/3187* (2006.01)
*G01R 31/36* (2006.01)

(52) U.S. Cl.
CPC ......... *G01R 31/3187* (2013.01); *G01R 31/362* (2013.01); *G01R 31/3606* (2013.01); *G01R 31/3658* (2013.01)

(58) Field of Classification Search
CPC ............ G01R 31/3648; G01R 31/3627; G01R 31/3662; G01R 31/3631; Y02E 60/12
(Continued)

(56) References Cited

U.S. PATENT DOCUMENTS 8,820,446 B2 * 9/2014 Kusumi .................. B60K 6/46
180/65.27
2010/0301868 A1  12/2010 Ishikawa et al.
(Continued)

FOREIGN PATENT DOCUMENTS

JP        02-004389 U    1/1990
JP        2009-201189 A  9/2009
(Continued)

*Primary Examiner* — Arun Williams
(74) *Attorney, Agent, or Firm* — Andrews Kurth Kenyon LLP

(57) ABSTRACT

An object is to provide, at low costs, a function for determining whether a monitoring section should execute a self-diagnosis. A monitoring system has a monitoring section for acquiring information on the charge and discharge state of an electric storage device and a determination section for determining the charge and discharge state of the electric storage device on the basis of information acquired by the monitoring section. The determination section has an output section for continuously outputting, to the monitoring section, a stepped signal made up of a High signal and a Low signal, and as well, when the charge and discharge state of the electric storage device has been determined to fall within an allowable range on the basis of the information acquired from the monitoring section, outputs a diagnosis permit signal that is a unique stepped signal having a period different from that before the determination, and when the signal received from the determination section has been determined to be the diagnosis permit signal, the monitoring section executes a self-diagnosis for detecting an abnormal event in the monitoring section.

4 Claims, 9 Drawing Sheets

(58) Field of Classification Search
USPC .......................................................... 324/426
See application file for complete search history.

(56) References Cited

U.S. PATENT DOCUMENTS

2011/0316548 A1* 12/2011 Ghantous ........... G01R 31/3637
                                                                324/427
2012/0259569 A1* 10/2012 Miwa .................... H01M 10/04
                                                                 702/63

FOREIGN PATENT DOCUMENTS

| JP | 2010-183672 A | 8/2010 |
| JP | 2010-203790 A | 9/2010 |
| JP | 2010-279146 A | 12/2010 |
| JP | 2011-007564 A | 1/2011 |
| WO | 2010/150076 A1 | 12/2010 |

* cited by examiner

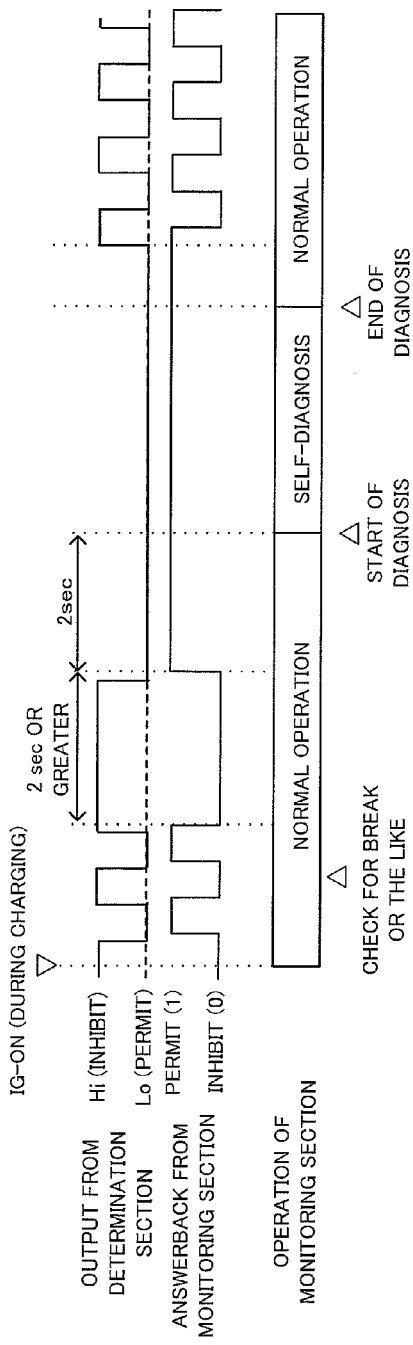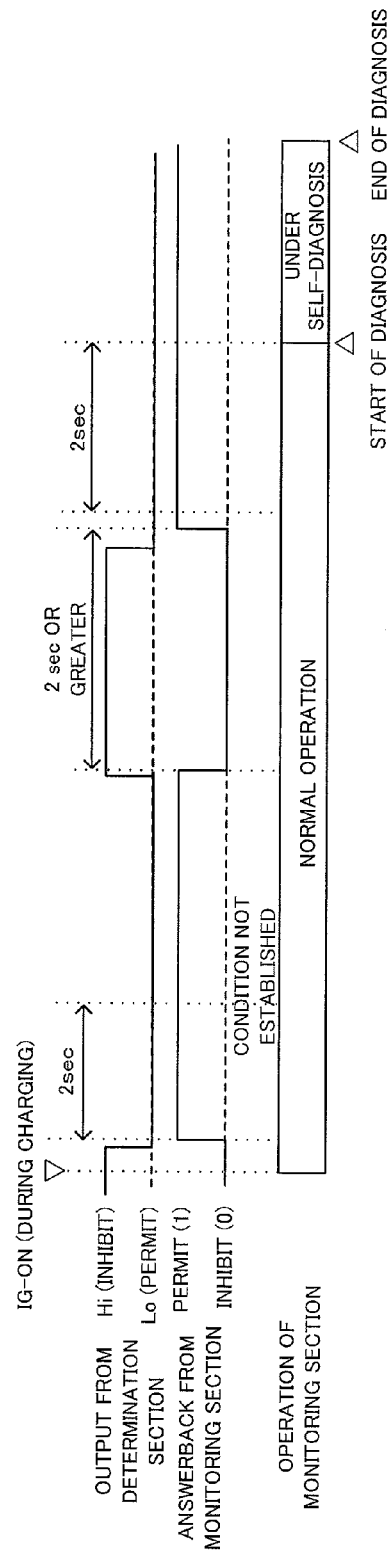

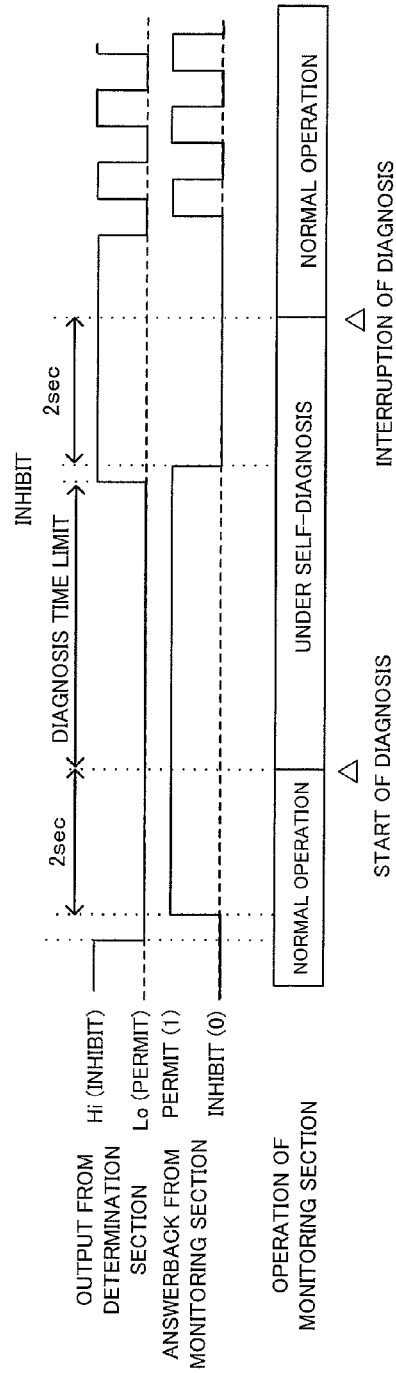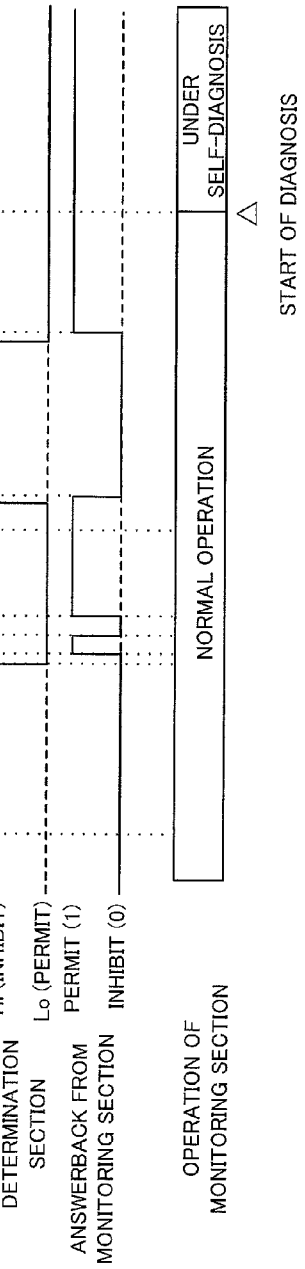

MONITORING SYSTEM AND VEHICLE

CROSS-REFERENCE TO RELATED APPLICATIONS

This is a national phase application based on the PCT International Patent Application No. PCT/JP2012/008181 filed Dec. 21, 2012, claiming priority to Japanese patent application No. 2011-279687 filed Dec. 21, 2011, the entire contents of both of which are incorporated herein by reference.

TECHNICAL FIELD

The present invention relates to a self-diagnosis technique for a monitoring section that acquires information on the charge and discharge state of an electric storage device.

BACKGROUND ART

In recent years, attention is received by vehicles which have a assembled battery that serves as the power source of the vehicles. The assembled battery of this type includes a monitoring section which monitors the charge and discharge state (for example, overcharge and overdischarge) of the assembled battery on the basis of information acquired by a voltage detection circuit included in the monitoring section. On the other hand, such a case in which an abnormal event may occur in the voltage detection circuit itself can also be conceived. Thus, in order to detect the overcharge and overdischarge with accuracy, it is necessary to adequately execute a self-diagnosis of the voltage detection circuit. That is, there is a possibility that the overcharge and overdischarge of the assembled battery can be overlooked unless the chance of the self-diagnosis is adequately ensured.

Disclosed in Patent Literature 1 is an overcharge detector for an on-board secondary battery to which charge and discharge control is provided in accordance with a charge control target value during the operation of the vehicle. The overcharge detector for the on-board secondary battery includes: a first overvoltage detection circuit for detecting an overcharge of the secondary voltage; a second overvoltage detection circuit for detecting an overcharge of the secondary voltage, the second overvoltage detection circuit being provided in parallel to the first overvoltage detection circuit; and a self-diagnosis section configured to execute a self-diagnosis for detecting an abnormal event in the first and second overvoltage detection circuits when the operation of the vehicle is ended. In the overcharge detector with the above-configuration, the self-diagnosis section includes: a diagnosis start determination section for directing the execution of the self-diagnosis on conditions that at the time of the request for the self-diagnosis, the voltage of the secondary battery is within a predetermined voltage range that permits the self-diagnosis of the first and second overvoltage detection circuits; and a change request section for requesting a change in the charge control target value during the next operation of the vehicle to a value higher than the current value when the diagnosis start determination section has determined that the voltage of the secondary battery at the time of the request for the self-diagnosis is lower than the predetermined voltage range.

CITATION LIST

Patent Literature

Patent Literature 1: Japanese Patent Application Laid-Open No. 2010-203790

SUMMARY OF INVENTION

Technical Problem

Since detecting the overcharge and overdischarge state is very critical in protecting the assembled battery, it is necessary to construct a vehicle system so that a self-diagnosis is executed at appropriate timing. It is an object of the present invention to provide, at low costs, a function for determining whether a monitoring section should execute a self-diagnosis.

Solution to Problem

To address the aforementioned problem, a monitoring system according to the present invention includes: (1) a monitoring section for acquiring information on a charge and discharge state of an electric storage device; and a determination section for determining the charge and discharge state of the electric storage device on the basis of the information acquired by the monitoring section, wherein the determination section has an output section for continuously outputting, to the monitoring section, a stepped signal made up of a High signal and a Low signal and when the charge and discharge state of the electric storage device has been determined to fall within an allowable range on the basis of the information acquired from the monitoring section, outputs a diagnosis permit signal that is a unique stepped signal having a period that is different from that before the determination, and the monitoring section executes a self-diagnosis for detecting an abnormal event in the monitoring section when the signal received from the determination section has been determined to be the diagnosis permit signal.

(2) In the aforementioned configuration (1), the determination section can inhibit charge or discharge of the electric storage device when the charge and discharge state of the electric storage device has been determined to fall within an allowable range.

(3) In the aforementioned configuration (1) or (2), the monitoring section can output a signal received from the determination section as an answerback signal to the determination section; and the determination section can output the diagnosis permit signal again when the answerback signal in response to the diagnosis permit signal outputted to the monitoring section is different from the diagnosis permit signal. According to the configuration (3), it is possible to execute a self-diagnosis of the monitoring section even when the diagnosis permit signal outputted from the determination section is not identified as a diagnosis permit signal by the monitoring section.

(4) A vehicle has the monitoring system as set forth in any one of (1) to (3) above, wherein the electric storage device may supply power to a motor for running the vehicle and may also be charged from a power supply external to the vehicle.

Advantageous Effects of Invention

It is possible to provide, at low costs, a function for determining whether a monitoring section should execute a self-diagnosis.

BRIEF DESCRIPTION OF DRAWINGS

FIG. 8 is a timing chart showing the processing performed by the monitoring system (during normal operation).

FIG. 9 is a timing chart showing the processing performed by the monitoring system (when conditions are not satisfied in a preceding stage).

FIG. 12 is a timing chart showing the processing performed by the monitoring system (when a diagnosis time limit is set to a self-diagnosis).

FIG. 13 is a timing chart showing the processing performed by the monitoring system (when a noise is contained in a diagnosis permit signal).

DESCRIPTION OF EMBODIMENTS

Now, a description will be made to an example of the present invention.

Figure 1:
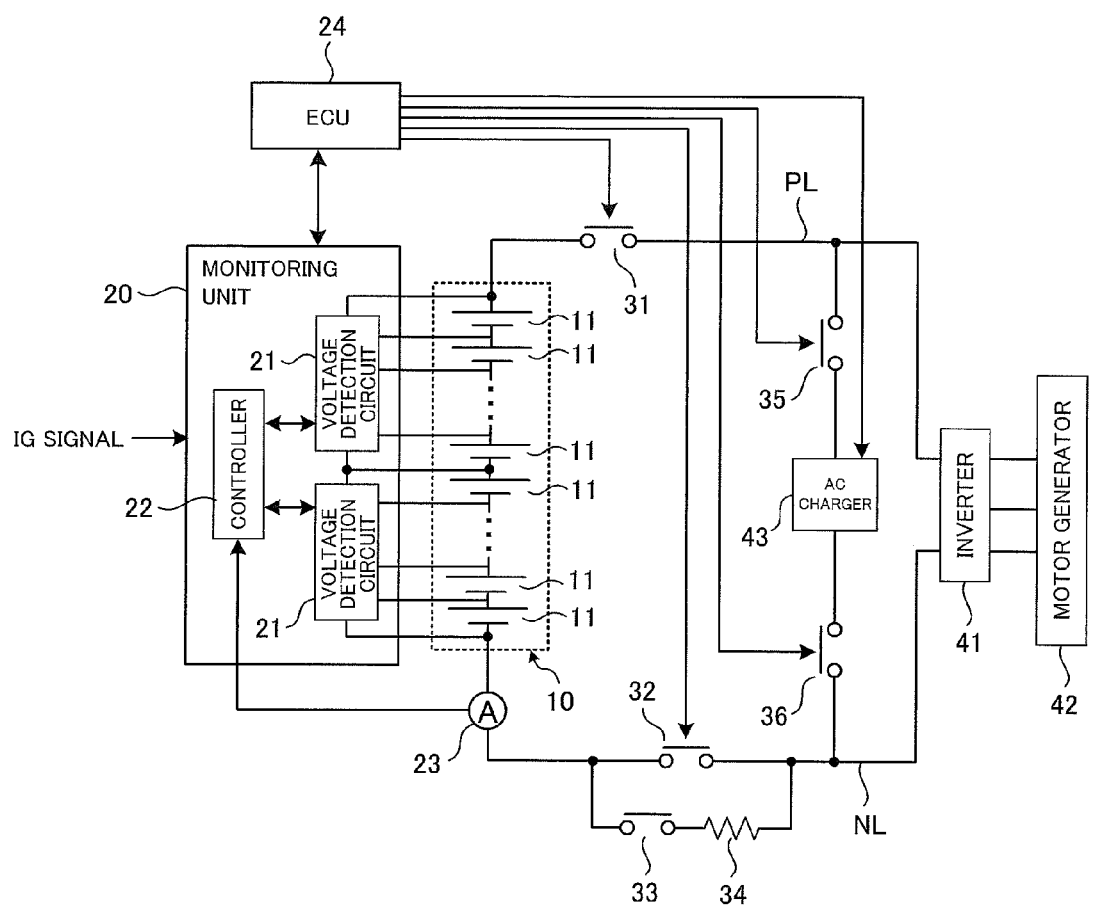
FIG. 1 is a view illustrating the configuration of a vehicle.

Referring to FIG. 1, a description will be made to a vehicle in which a monitoring system according to the present example is mounted. FIG. 1 is a view illustrating the configuration of the vehicle. Vehicles of this type may include hybrid automobiles and electric cars.

The hybrid automobile is a vehicle which includes a assembled battery as well as another power source, such as an internal combustion engine or a fuel cell, as a power source for outputting energy to be used for running the vehicle. The electric car is a vehicle which includes only a assembled battery as the power source of the vehicle. The vehicle of the present example can also be supplied with power from an external power source so as to charge the assembled battery.

The battery system of the present example has a assembled battery 10. The assembled battery 10 has a plurality of electric cells 11 which are connected in series. The electric cell 11 to be employed may be a secondary battery such as a nickel hydrogen battery or a lithium ion battery. On the other hand, in place of the secondary battery, it is also possible to employ the electric double layer capacitor.

The number of electric cells 11 can be set, as appropriate, on the basis of the output to be required or the like. In the present example, although a plurality of electric cells 11 are connected in series, a plurality of electric cells 11 connected in parallel may also be included in the assembled battery 10.

A monitoring unit 20 monitors the charge and discharge state (the voltage value or the current value) of the assembled battery 10. The monitoring unit 20 includes voltage detection circuits 21 which detect the voltage of each electric cell 11. The monitoring unit 20 has two voltage detection circuits 21, and each of the voltage detection circuits 21 can detect the voltage of the battery block included in the assembled battery 10 (referred to as the block voltage). In the present example, the assembled battery 10 is divided into two battery blocks, and each battery block is made up of a plurality of electric cells 11 that are connected in series. The block voltage is the total sum (total voltage) of the voltages of the plurality of electric cells 11 included in each battery block.

In the present example, the two voltage detection circuits 21 are provided so as to detect the voltages of the two battery blocks included in the assembled battery 10. However, the invention is not limited thereto. That is, the number of battery blocks can be set as appropriate. Here, each battery block may only have to include at least two electric cells 11 that are connected in series. The voltage detection circuit 21 can be provided to the number of battery blocks.

The voltage detection circuits 21 detect the voltage of a corresponding battery block as well as detect the voltage of each electric cell 11 included in the corresponding battery block. Here, the voltage detection circuit 21 operates by receiving a control signal from a controller 22 included in the monitoring unit 20. On the other hand, detection information provided by the voltage detection circuits 21 is outputted to the controller 22.

A current sensor 23 detects a charge and discharge current flowing through the assembled battery 10, and then outputs the detection result to the controller 22 of the monitoring unit 20.

An ECU 24 outputs a control signal to system main relays 31, 32, and 33, thereby switching each of the system main relays 31 to 33 between ON and OFF. Furthermore, the ECU 24 outputs the control signal to charging relays 35 and 36, thereby switching each of the charging relays 35 and 36 between ON and OFF.

The ECU 24 outputs a reference signal to the monitoring unit 20. Here, the reference signal is a stepped signal which is made up of a High signal and a Low signal, and the timing at which the High signal and the Low signal are switched over (i.e., the period of the signal) is set to a particular value (hereafter referred to as the reference period).

The positive electrode terminal of the assembled battery 10 is connected with the system main relay 31. The system main relay 31 is switched between ON and OFF by receiving the control signal from the ECU 24. The negative electrode terminal of the assembled battery 10 is connected with the system main relay 32. The system main relay 32 is switched between ON and OFF by receiving the control signal from the ECU 24.

The system main relay 33 and a limiter resistor 34 are connected in parallel to the system main relay 32. The system main relay 33 is switched between ON and OFF by receiving the control signal from the ECU 24. The limiter resistor 34 is used to reduce the flow of an inrush current when the assembled battery 10 is connected to an inverter 41.

The information on the ignition switch of the vehicle (ON/OFF) is inputted to the monitoring unit 20, which then outputs the information on the ignition switch to the ECU 24. In response to the ignition switch being switched from OFF to ON, the assembled battery 10 is connected to the inverter 41.

To connect the assembled battery 10 to the inverter 41, the ECU 24 switches the system main relay 31 from OFF to ON and as well, switches the system main relay 33 from OFF to ON. This allows a current to flow through the limiter resistor 34. Next, after having switched the system main relay 32 from OFF to ON, the ECU 24 switches the system main relay 33 from ON to OFF. This completes the connection, of the assembled battery 10 to the inverter 41. On the other hand, to disconnect the assembled battery 10 from the inverter 41, the ECU 24 switches the system main relays 31 and 32 from ON to OFF.

The inverter 41 converts DC power from the assembled battery 10 into AC power so as to output the AC power to a motor generator 42. The motor generator 42 to be employed may be, for example, a three-phase AC motor. The motor generator 42 receives the AC power from the inverter 41 so as to produce kinetic energy for running the vehicle. The kinetic energy produced by the motor generator 42 is transmitted to drive wheels.

To decelerate or stop the vehicle, the motor generator 42 converts the kinetic energy produced during braking of the vehicle into electric energy (AC power). The inverter 41 converts AC power generated by the motor generator 42 into DC power, and then outputs the DC power to the assembled battery 10. This allows the assembled battery 10 to accumulate regenerative electric power.

In the present example, the assembled battery 10 is connected to the inverter 41. However, the invention is not limited thereto. More specifically, the assembled battery 10 can also be connected to a voltage converter and then the voltage converter can be connected to the inverter 41. The voltage converter can be used to step up the output voltage of the assembled battery 10. Furthermore, the voltage converter can also step down the output voltage from the inverter 41 to the assembled battery 10.

The lines (a positive electrode line PL and a negative electrode line NL) for connecting between the assembled battery 10 and the inverter 41 are connected with an AC charger 43. The AC charger 43 converts the AC power supplied from an external power supply into DC power, which is then supplied to the assembled battery 10. The AC charger 43 operates by receiving the control signal from the ECU 24. Power can be supplied from the external power supply to the AC charger 43 through a cable or in a non-contact manner.

The external power supply is defined as a power source that is located at a place (outside the vehicle) that is different from the vehicle on which the battery system of the present example is mounted. The external power supply to be employed may be, for example, a commercial power supply. In the present example, an AC power supply is used as the external power supply, but a DC power supply may also be employed. In this case, the AC charger 43 needs not to be used to convert AC power into DC power.

The charging relay 35 is provided between the AC charger 43 and the positive electrode line PL and the charging relay 36 is provided between the AC charger 43 and the negative electrode line NL. The charging relays 35 and 36 receive the control signal from the ECU 24 so as to be switched between ON and OFF. To charge the assembled battery 10 by the power from the external power supply, the ECU 24 switches the charging relays 35 and 36 from OFF to ON. At this time, the system main relays 31 and 32 are in an ON state.

In the present example, the AC charger 43 is mounted on the vehicle. However, the present invention is also applicable even to a case in which the AC charger 43 is located at a place different from the vehicle. Even when the AC charger 43 is located at a place different from the vehicle, the battery system is provided with the charging relays 35 and 36, so that the ECU 24 provides ON/OFF control to the charging relays 35 and 36.

When the ECU 24 has determined that the charge and discharge state of the assembled battery 10 falls within an allowable range during charging the assembled battery 10 using the AC charger 43, the ECU 24 outputs, to the monitoring unit 20, a diagnosis permit signal for permitting the start of a self-diagnosis. Here, the diagnosis permit signal is a unique stepped signal that has a period different from that of the reference signal.

When the monitoring unit 20 has started a self-diagnosis, it is necessary to temporarily stop the monitoring mode in which the monitoring unit 20 monitors the charge and discharge state of the assembled battery 10. Thus, the self-diagnosis of the monitoring unit 20 is permitted when the charge and discharge state of the assembled battery 10 falls within an allowable range, that is, only when the assembled battery 10 is clearly not in an overcharge state and an overdischarge state. This makes it possible to prevent the monitoring unit 20 from overlooking the overcharge state and the overdischarge state of the assembled battery 10 without detecting the states.

Thus, "the charge and discharge state falling within an allowable range" means that the assembled battery 10 is at a normal accumulation level at which the assembled battery 10 is clearly not in an overcharge state and an overdischarge state. Here, when there is an abnormal event in the monitoring unit 20, an error is found between the information on the voltage of the assembled battery 10 acquired by the monitoring unit 20 and the information on the actual voltage. Thus, by taking this error into account, it is necessary to set a normal accumulation level.

Here, the overcharge state means the state in which the amount of accumulation of the assembled battery 10 has reached a charge end voltage or the state in which the charge end voltage has been exceeded. The overdischarge state means the state in which the amount of accumulation of the assembled battery 10 has reached the discharge end voltage or the state in which the discharge end voltage has been exceeded. Note that a voltage $V_1$ may be a voltage value of an electric cell 11 of those included in the assembled battery 10, the electric cell 11 having a voltage value that is farthest from the center value of the allowable range. The voltage $V_1$ may also be a block voltage or the total voltage of the assembled battery 10.

According to this embodiment, a trigger signal for causing the monitoring unit 20 to start a self-diagnosis can be easily produced by controlling the period of the reference signal that is outputted by the ECU 24 to the monitoring unit 20 all the time. Since this eliminates the necessity of a separate circuit for producing the trigger signal, it is possible to reduce costs.

Here, such a method is also conceivable in which the ECU 24 outputs a specific voltage value of the assembled battery 10 to the monitoring unit 20 to employ the value as the aforementioned trigger signal. However, this requires a separate AD converter for obtaining a specific voltage value with an increase in costs.

Figure 2:
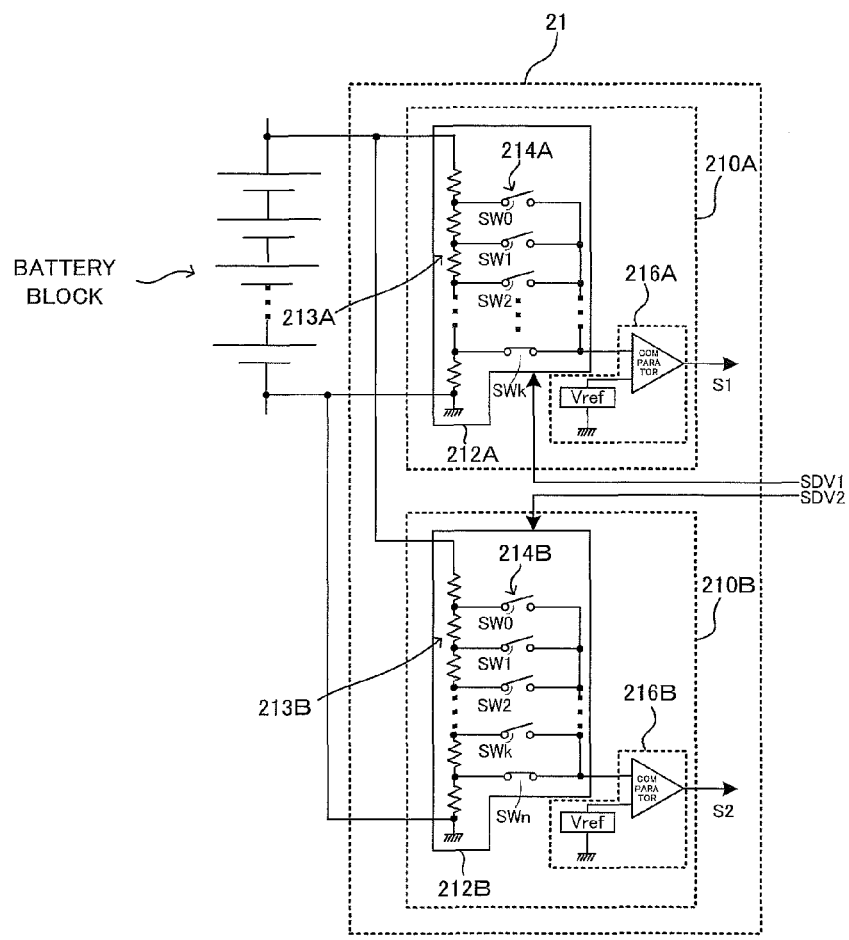
FIG. 2 is a view illustrating the configuration of voltage detection circuits.

Now, a description will be made to the self-diagnosis that the monitoring unit 20 executes. FIG. 2 shows the configuration of the voltage detection circuit. The voltage detection circuit 21 has overvoltage detection circuits 210A and 210B which are provided in parallel corresponding to the respective battery blocks. However, the self-diagnosis may be carried out in various methods, and the invention is not limited the methods below.

The overvoltage detection circuit 210A includes a potential divider section 212A and a voltage comparator section 216A. The potential divider section 212A includes a potential divider resistor 213A and a potential divider ratio control part 214A. The potential divider resistor 213A is made up of a plurality of resistor elements which are connected in series between a positive electrode Np and a negative electrode Nn of a battery block. The potential divider ratio control part 214A has switch elements SW0 to SWk which are each connected between a connection node between a plurality of resistor elements of the potential divider resistor 213A and a node Na to which a divided voltage is outputted. One of the switch elements SW0 to SWk is selectively turned ON in response to a control signal SDV1.

The voltage comparator section 216A compares a predetermined reference voltage Vref with a divided voltage outputted to the node Na. Then, when the divided voltage is higher than the reference voltage Vref, a detection signal S1 is outputted, whereas the detection signal S1 is not outputted when the divided voltage is not higher than the reference voltage ref.

By switching among the switching positions of the switch elements SW0 to SWk in response to the control signal SDV1, it is possible to switch among the potential divider ratios of the potential divider section 212A, that is, the ratios of the divided voltage to the output voltage (block voltage) Vc of the battery block (the divided voltage/the block voltage). By switching among the potential divider ratios in this manner, it is possible to change, with the reference voltage Vref fixed, a comparison voltage of which level is compared by the voltage comparator section 216A substantially with a block voltage Vc.

Figure 3:
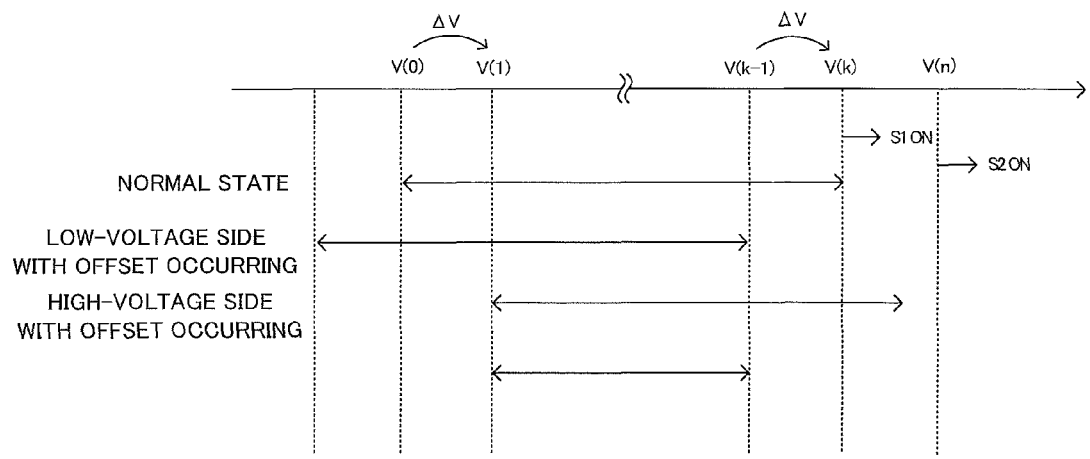
FIG. 3 is a view schematically illustrating cases where there is a mismatch or not in the voltage detection circuit.

For example, as illustrated in FIG. 3, the potential divider ratio of the potential divider section 212A is set so that at the time of normal operation other than a self-diagnosis, the detection signal S1 is outputted when Vc>V(k), whereas the detection signal S1 is turned OFF when Vc≤V(k). More specifically, the potential divider section 212A is designed to achieve the aforementioned potential divider ratio when the switch element SWk is selectively turned ON by the control signal SDV1.

Then, the potential divider section 212A is designed to achieve a potential divider ratio which allows the detection signal S1 to compare the levels between the block voltage Vc and the voltages V(0), V(1), and V(2) when the switch elements SW0 and SW1, SW2, . . . are each turned ON in place of the switch element SWk. For example, when the switch element SW0 is selectively turned ON by the control signal SDV1, the detection signal S1 is turned ON when Vc>V(1), while the detection signal S1 is turned OFF when Vc≤V(1).

As illustrated in FIG. 3, the potential divider section 212A is designed so that by switching among the switching positions of the switch elements, the detection signal S1 sequentially indicates the result of comparisons between the comparison voltages V(0), V(1), . . . , V(k−1), and V(k) in increments of ΔV and the block voltage Vc. As a result, the switch element SWk is turned OFF at the time of a self-diagnosis of the monitoring unit 20, while any one of the other switches can be turned ON to be thereby capable of comparing the block voltage Vc with the comparison voltages V(0) to V(k−1) that are different from those at the time of normal operation.

Referring to FIG. 2, like the overvoltage detection circuit 210A, the overvoltage detection circuit 210B includes a potential divider section 212B and a voltage comparator section 216B. The potential divider section 212B includes a potential divider resistor 213B and a potential divider ratio control part 214B. Like the potential divider resistor 213A, the potential divider resistor 213B is made up of a plurality of resistor elements connected in series between the positive electrode Np and the negative electrode Nn of a battery block.

The potential divider ratio control part 214B has the switch elements SW0 to SWk, and SWn which are each connected between a connection node between a plurality of resistor elements of the potential divider resistor 213B and a node Nb to which the divided voltage is outputted. Any one of the switch elements SW0 to SWk, and SWn is selectively turned ON in response to a control signal SDV2.

The potential divider section 212B has a range of potential divider ratios different from that of the potential divider section 212A. As shown in FIG. 3, when the switch element SWn is turned ON, a detection signal S2 indicates the result of a comparison between V(n) higher than the voltage V(k) and the block voltage Vc. On the other hand, when the switch elements SW0 to SWk are each turned ON, the detection signal S2 indicates, like the detection signal S1, the result of a comparison between the comparison voltages V(0) to V(k) and the block voltage Vc.

As described above, the overvoltage detection circuits 210A and 210B are provided to form a duplex system in parallel for a common battery block. Furthermore, as shown in FIG. 3, during normal operation, it is possible to detect an overcharge at a level of the block voltage Vc>V(k) by the detection signal S1 from the overvoltage detection circuit 210A as well as to detect a serious overcharge at a level of the block voltage Vc>V(n) by the detection signal S2 from the overvoltage detection circuit 210B. Then, on the basis of the detection signals S1 and S1 from each overcharge detection circuit 200, the controller 22 shown in FIG. 1 turns ON an overcharge detection signal Foc1 when the detection signal S1 is turned ON in any one of the battery blocks, whereas turning ON an overcharge detection signal Foc2 when the detection signal S2 is turned ON in any one of the battery blocks.

However, there is a possibility that an error will occur in the detection of an overvoltage due to the occurrence of an error in the characteristics of the overvoltage detection circuits 210A and 210B. For example, as shown in FIG. 3, a change in the potential divider ratio of the potential divider sections 212A and 212B may lead to an offset which will cause the voltage range that can be detected by switching among the switch elements SW0 to SWk to shift from the original V(0) to V(k) to either a lower-voltage side or a higher-voltage side. Once an offset occurs, in the overvoltage detection circuits 210A and 210B, there is a possibility of overlooking an overvoltage that is primarily to be detected or unnecessarily restricting the charge and discharge of the battery due to an erroneous detection of the overvoltage. Thus, the self-diagnosis for detecting an abnormal event as described above in the overvoltage detection circuits 210A and 210B is executed as follows.

Figure 4:
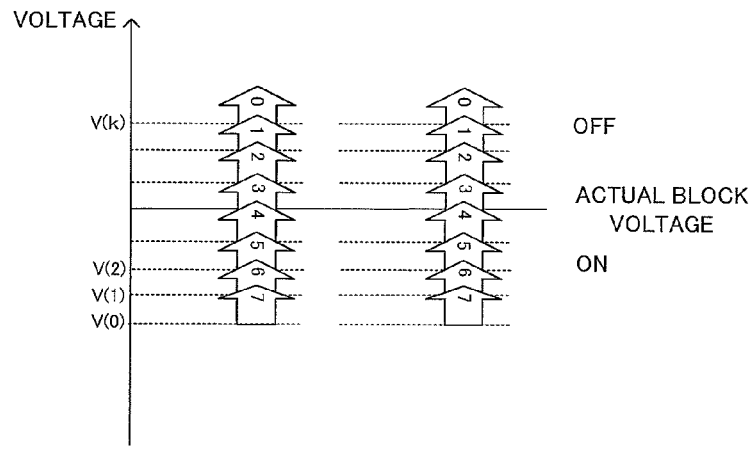
FIG. 4 is a view schematically illustrating a case where there is not a mismatch in the voltage detection circuit.

FIG. 4 shows the result of a self-diagnosis in the case where there is no characteristic mismatch (offset)) between the overvoltage detection circuits 210A and 210B and both the circuits are operating in a normal condition.

During a self-diagnosis, the control signals SDV1 and SDV2 are produced synchronously in the overvoltage detection circuits 210A and 210B so as to sequentially selectively turn ON the same ones of the switch elements SW0 to SWk. This causes the potential divider ratio of the potential divider sections 212A and 212B to be synchronously varied in a stepwise manner. As a result, the overvoltage detection circuits 210A and 210B can sequentially compare the block voltage with the comparison voltages V(0) to V(k) in parallel at the same time.

As shown in FIG. 4, when no characteristic mismatch occurs between the overvoltage detection circuits 210A and 210B, the detection signal S1 of the overvoltage detection circuit 210A and the detection signal S2 of the overvoltage detection circuit 210B are changed from OFF to ON at the same timing in the process in which the potential divider ratio is varied in a stepwise manner so as to sequentially reduce, from V(k), the comparison voltage to be compared with the block voltage Vc. In the example of FIG. 4, in the configuration which is capable of switching among potential divider ratios in eight steps in total, both the detection signals S1 and S2 are turned from OFF to ON at a point in time at which three steps have been taken. That is, when the detection signals S1 and S2 always coincide with each other, no characteristic mismatch occurs between the overvoltage detection circuits 210A and 210B, and it is thus possible to obtain a self-diagnosis result of being normal.

Figure 5:
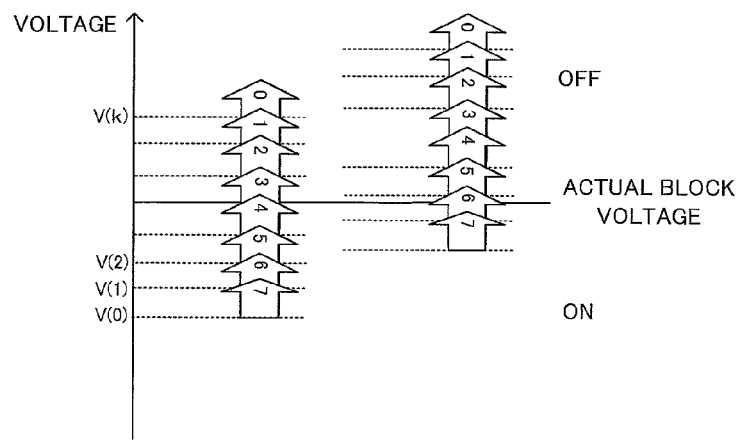
FIG. 5 is a view schematically illustrating a case where there is a mismatch in the voltage detection circuit.
Figure 6:
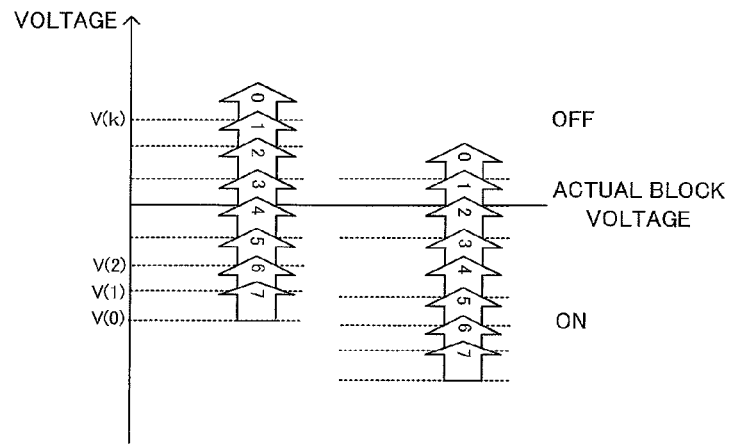
FIG. 6 is a view schematically illustrating a case where there is a mismatch in the voltage detection circuit.

On the other hand, FIG. 5 shows a self-diagnosis result in the case where the special envoy of the overvoltage detection circuit 210B is shifted toward a higher-voltage side, and FIG. 6 shows a self-diagnosis result in the case where the characteristics of the overvoltage detection circuit 210B is shifted toward a lower-voltage side.

In these cases, as described in relation to FIG. 4, it can be understood that there will occur a period in which the detection signals S1 and S2 are inconsistent with each other when the control signals SDV1 and SDV2 are set to perform a self-diagnosis. That is, in the process of varying the potential divider ratio in which the comparison voltage to be compared with an actual block voltage Vc is sequentially reduced from V(k), the case of FIG. 5 shows the occurrence of the inconsistency that the detection signal S1 is ON and the detection signal S2 is OFF, and the case of FIG. 6 shows the occurrence of the inconsistency that the detection signal S1 is OFF and the detection signal S2 is ON.

The occurrence of these phenomena allows for detecting a possibility that a characteristic mismatch has occurred between the overvoltage detection circuits 210A and 210B and thus an overvoltage may not be accurately detected.

Figure 7:
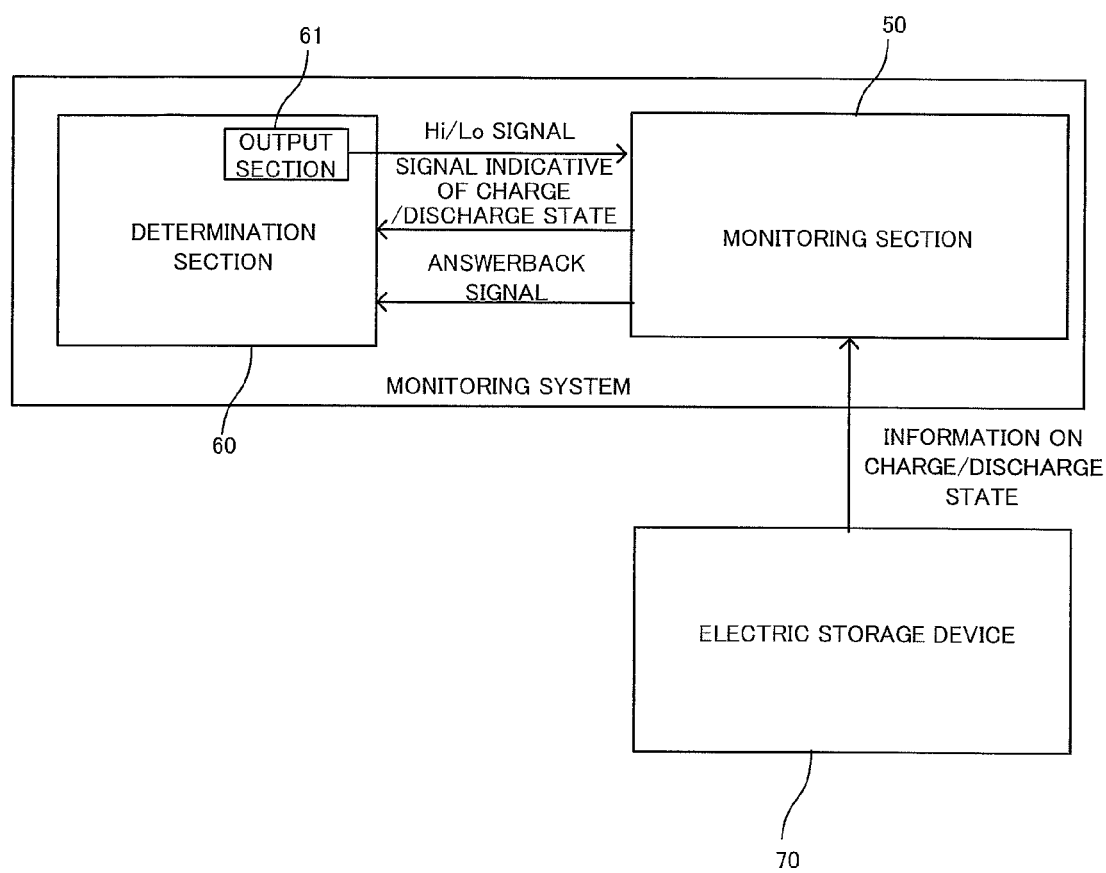
FIG. 7 is a functional block diagram illustrating a monitoring system.

Now, a description will be made to a diagnosis permit signal for directing the monitoring unit 20 to execute a self-diagnosis. FIG. 7 is a functional block diagram illustrating a monitoring system. Referring to the figure, a monitoring section 50 acquires information on the charge and discharge state of an electric storage device 70. Here, referring to FIGS. 1 and 7 to make a comparison therebetween, the monitoring section 50 is equivalent to the monitoring unit 20, and the electric storage device 70 is equivalent to the assembled battery 10. A determination section 60 determines the charge and discharge state of the electric storage device 70 on the basis of the information acquired by the monitoring section 50. Referring to FIGS. 1 and 7 to make a comparison therebetween, the determination section 60 is equivalent to the ECU 24.

Referring to FIG. 7, the determination section 60 has an output section 61 which continuously outputs a stepped signal made up of a High signal and a Low signal to the monitoring section 50. When the determination section 60 has determined on the basis of the information acquired from the monitoring section 50 that the charge and discharge state of the electric storage device 70 falls within an allowable range, the determination section 60 outputs a diagnosis permit signal which is a unique stepped signal having a period different from that before the determination. Here, the meaning of "the allowable range" has already been explained above, and will not be repeatedly mentioned.

When the monitoring section 50 has determined that the signal received from the output section 61 is a diagnosis permit signal, the monitoring section 50 executes a self-diagnosis of the monitoring section 50. The method of the "self-diagnosis" has already been explained above, and thus will not be repeatedly mentioned. Furthermore, the monitoring section 50 outputs (replies) the signal received from the output section 61 to the determination section 60 as an answerback signal. The determination section 60 will output again the diagnosis permit signal when the answerback signal in response to the diagnosis permit signal outputted to the monitoring section 50 is different from the diagnosis permit signal.

Here, the answerback signal in response to the diagnosis permit signal is a signal which has basically the same pattern as that of the diagnosis permit signal, but may also be a signal which has a pattern different from that of the diagnosis permit signal due to a noise or the like contained in the signal. In this case, the determination section 60 can determine by analyzing the answerback signal that the outputted signal has not been processed in the monitoring section 50 as the diagnosis permit signal. In this context, the determination section 60 outputs again the diagnosis permit signal to the monitoring section 50, thereby allowing for executing a self-diagnosis.

Now, a description will be made in detail to the signal outputted from the output section 61 of the determination section 60. FIGS. 8 to 13 are a timing chart showing the processing performed by the monitoring system. The output section 61 according to this embodiment is assumed to output, during normal operation, a stepped signal (i.e. the aforementioned reference signal) which is obtained by alternately switching between the High signal (inhibition signal) and the Low signal (permit signal) with a period of one second. Here, the normal operation means the operation in which the monitoring section 50 does not execute a self-diagnosis.

Referring to FIG. 8, when the ignition switch is turned ON, the determination section 60 starts processing for determining whether to permit a self-diagnosis. The reference signal outputted from the output section 61 is received by the monitoring section 50 after a predetermined time has elapsed, and the monitoring section 50 outputs, as a rule, the same signal as that received from the output section 61 to the determination section 60 as the answerback signal. Thus, as illustrated, there is a time lag between the signal outputted from the output section 61 and the answerback signal outputted from the monitoring section 50.

When the determination section 60 has determined that a self-diagnosis may be started, the output section 61 outputs, in place of the reference signal, a unique diagnosis permit signal that has a period different from that of the reference signal, the unique diagnosis permit signal having the High signal (inhibition signal) continued for two seconds or more and the Low signal (permit signal) continued for two seconds or more. At a point in time at which the High signal has continued for two seconds or more and thereafter, the Low signal has continued for two seconds, the monitoring section 50 immediately starts a self-diagnosis. When the self-diagnosis has ended, the monitoring section 50 outputs, to the determination section 60, a signal indicative of the end of the self-diagnosis, and the determination section 60 returns to the normal operation (i.e., the operation for outputting the reference signal).

Referring to FIG. 9, immediately after the ignition switch is turned ON, the output section 61 outputs the Low signal (permit signal) for two seconds or more. However, since the High signal (inhibition signal) has not been outputted for two seconds or more before the Low signal (permit signal) is outputted, the conditions for the diagnosis permit signal are not satisfied. In this case, the monitoring section 50 starts a self-diagnosis after the conditions for the diagnosis permit signal are established.

Figure 10:
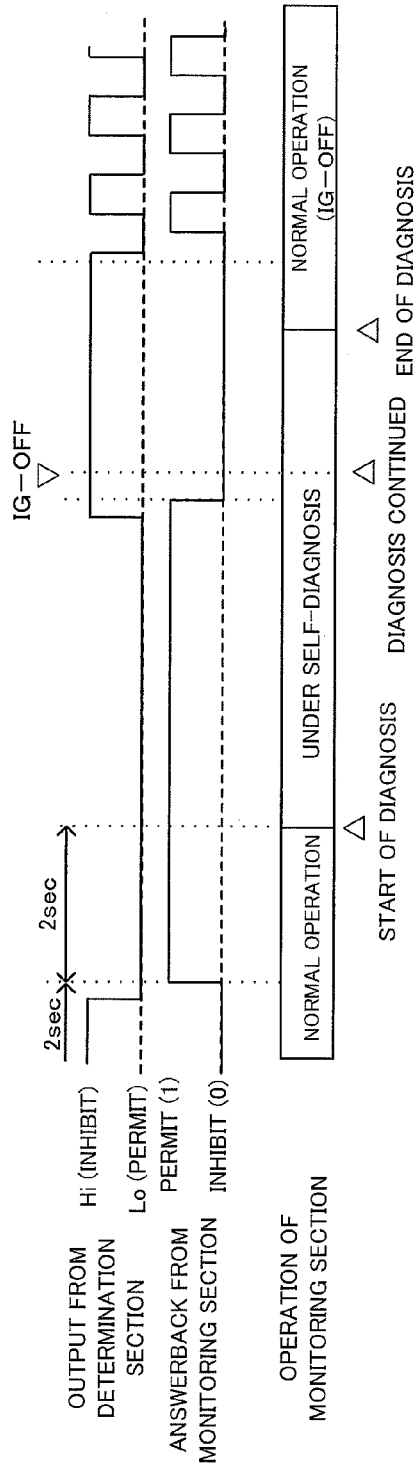
FIG. 10 is a timing chart showing the processing performed by the monitoring system (when an ignition switch is turned OFF during a self-diagnosis).

FIG. 10 shows the case where the ignition switch is switched from ON to OFF after the monitoring section 50 has started a self-diagnosis. Here, since the self-diagnosis is performed typically with the ignition switch in an OFF state, the self-diagnosis does not need to be interrupted even when the ignition switch has been switched from ON to OFF. In this context, when the ignition switch has been switched from ON to OFF during a self-diagnosis, the monitoring section 50 does not interrupt but continues the self-diagnosis to the end thereof.

Figure 11:
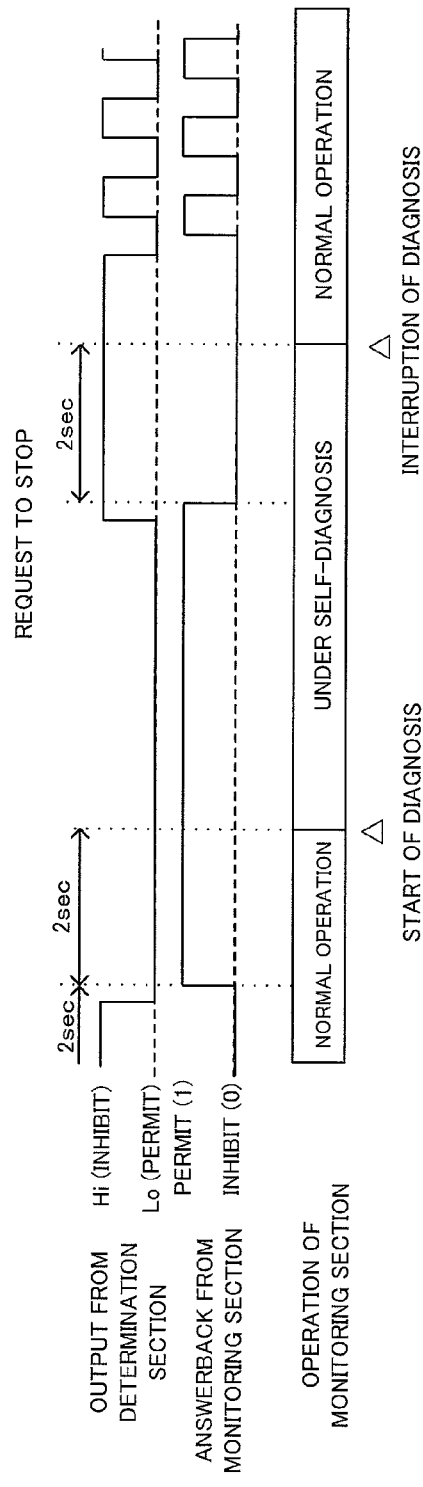
FIG. 11 is a timing chart showing the processing performed by the monitoring system (when a request to stop is issued during a self-diagnosis).

FIG. 11 shows the case where a request to stop a self-diagnosis has been issued after the monitoring section 50 has started the self-diagnosis. Here, the request to stop can be issued by a user, dealer or the like. The user or the like can request the monitoring section 50 to stop the self-diagnosis on a touch panel provided in the vehicle. In this case, the signal outputted from the output section 61 is switched from the diagnosis permit signal to the High signal (inhibition signal), and the monitoring section 50 interrupts the self-diagnosis at a point in time at which the High signal (inhibition signal) has continued for two seconds.

FIG. 12 shows the case where there is provided a self-diagnosis time limit. The monitoring section 50 interrupts a self-diagnosis when the self-diagnosis is not completed within the self-diagnosis time limit after the self-diagnosis was started. In this case, after the self-diagnosis time limit has elapsed, the signal outputted from the output section 61 is switched from the diagnosis permit signal to the High signal (inhibition signal), and the monitoring section 50 interrupts the self-diagnosis at a point in time at which the High signal (inhibition signal) has continued for two seconds.

FIG. 13 shows the case where the monitoring section 50 does not identify, as the diagnosis permit signal, the diagnosis permit signal outputted from the output section 61. The output section 61 outputs the diagnosis permit signal, but the Low signal (permit signal) contains noise. Thus, the condition for the diagnosis permit signal, i.e., "that the inhibition signal continues for two seconds or more" prior to the permit signal is not satisfied. Thus, the monitoring section 50 cannot execute the self-diagnosis. In this case, by analyzing the answerback signal outputted by the monitoring section 50, the determination section 60 can determine that the diagnosis permit signal outputted from the determination section 60 has not been identified as the diagnosis permit signal. In this case, the output section 61 outputs again the diagnosis permit signal to cause the monitoring section 50 to execute a self-diagnosis.

Figure 14:
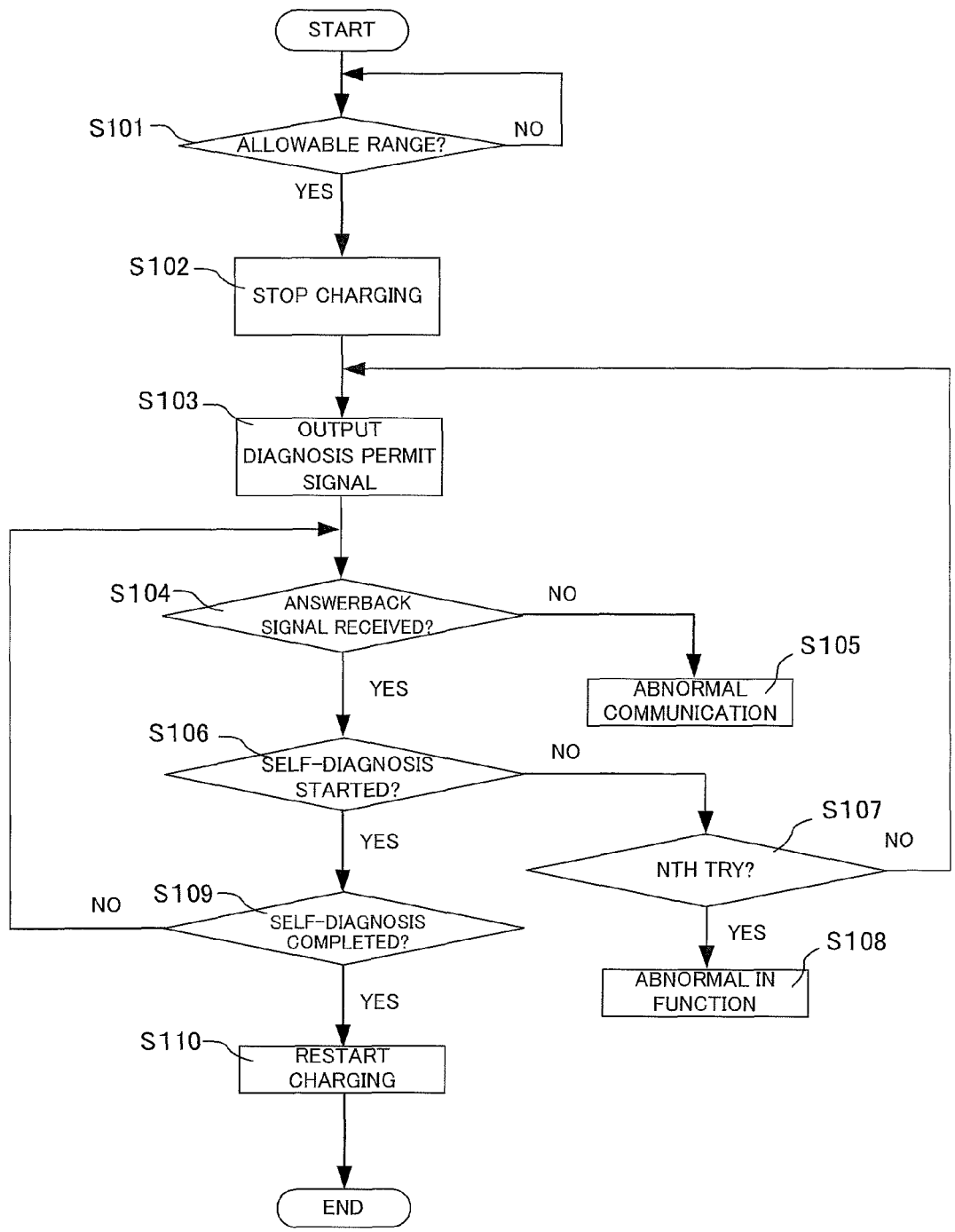
FIG. 14 is a process flowchart followed by a determination section.

Now, referring to the flowchart of FIG. 14, a description will be made in detail to the processing performed by the determination section 60. Note that it is assumed that in the initial state, the assembled battery 10 is being charged by the AC charger 43. In step S101, the determination section 60 determines whether the charge and discharge state of the assembled battery 10 falls within an allowable range. If the charge and discharge state of the assembled battery 10 falls within an allowable range, the process proceeds to step S102. In step S102, the determination section 60 switches the relays 35 and 36 of the AC charger 43 from ON to OFF so as to stop charging the assembled battery 10, and then the process proceeds to step S103.

In step S103, the determination section 60 outputs the diagnosis permit signal to the monitoring section 50, and then the process proceeds to step S104. In step S104, the determination section 60 determines whether the monitoring section 50 has outputted the answerback signal. Then, the process proceeds to step S105 when the answerback signal is determined to have not yet been received, while the process proceeds to step S106 when the answerback signal is determined to have been received.

In step S105, the determination section 60 notifies the user or the like of the presence of an abnormal communication event. The notification means may be implemented by display on a display section provided inside the vehicle or by audio output from an audio output section.

In step S106, the determination section 60 determines on the basis of the answerback signal from the monitoring section 50 whether the monitoring section 50 has started a self-diagnosis. The process proceeds to step S107 when the self-diagnosis is determined to have not yet been started, while the process proceeds to step S109 when the self-diagnosis is determined to have been started.

In step S107, the determination section 60 determines whether the number of times of repeated outputs of the diagnosis permit signal has reached N times. The process proceeds to step S108 when the number of times of repeated outputs of the diagnosis permit signal has reached N times, while when the number of times of repeated outputs of the diagnosis permit signal has not yet reached N times, the process returns to step S103 to output the diagnosis permit signal again. Here, the N times may be any number so long as the number is two or greater. For example, the N times may be two or three.

In step S108, the determination section 60 determines that the monitoring section 50 has an abnormal function event. When an abnormal function event is present, the determination section 60 notifies the user or the like of the presence of the abnormal function event. The notification means may be a method of displaying on a display section provided inside the passenger room of the vehicle or a method of outputting audio from an audio output section.

In step S109, the determination section 60 determines whether the signal which is transmitted by the monitoring section 50 and indicates that the self-diagnosis is completed has been received. When the signal indicative of the completion of the self-diagnosis has been received, the process proceeds to step S110.

In step S110, the determination section 60 switches the relays 35 and 36 of the AC charger 43 from OFF to ON and allows the assembled battery 10 to be charged, and the process then exits the flow.

Figure 15:
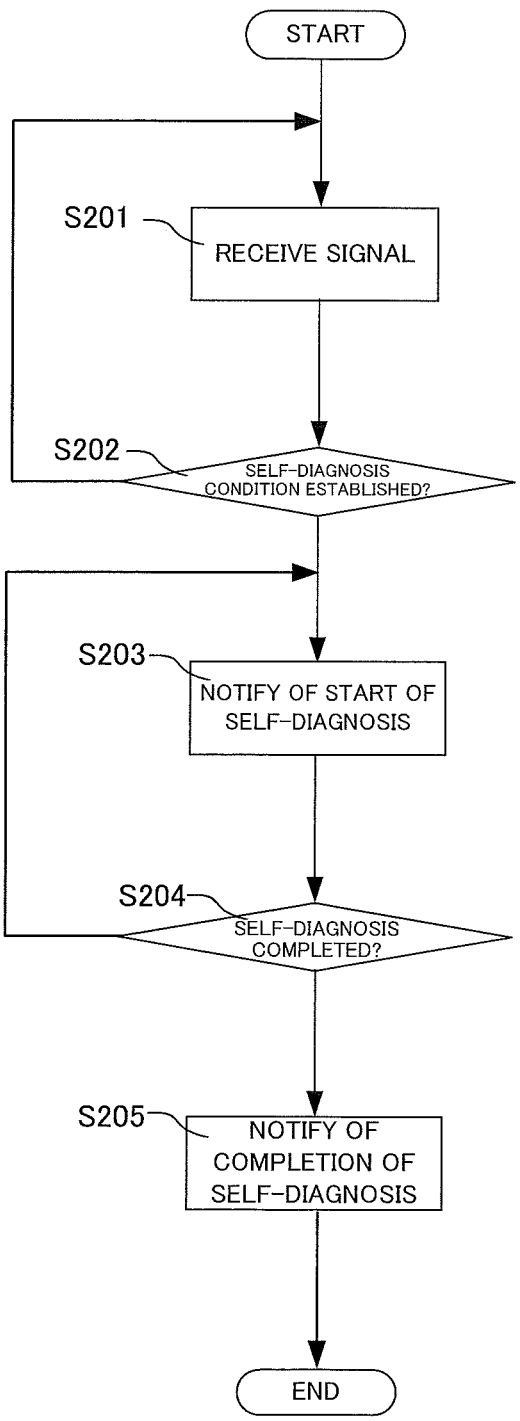
FIG. 15 is a process flowchart followed by a monitoring section.

Now, referring to the flowchart of FIG. 15, a description will be made to the processing performed by the monitoring section 50. In step S201, the monitoring section 50 receives a signal from the determination section 60, and then the process proceeds to step S202. In step S202, the monitoring section 50 determines whether the signal received from the determination section 60 is a diagnosis permit signal. When the signal received from the determination section 60 is the diagnosis permit signal, the process proceeds to step S203.

In step S203, the monitoring section 50 starts the self-diagnosis, and then the process proceeds to step S204. In step S204, the monitoring section 50 determines whether the self-diagnosis has been completed. When the self-diagnosis has been completed, then the process proceeds to step S205. In step S205, the monitoring section 50 outputs, to the determination section 60, the signal indicating that the self-diagnosis has been completed, and the process then exits the flow.

Modified Example 1

In the aforementioned embodiment, the monitoring section 50 determines whether the signal is the diagnosis permit signal on the basis of the durations of the High signal (inhibition signal) and the Low signal (permit signal) that are continuously outputted from the output circuit 61 of the determination section 60. However, the present invention is not limited thereto. The monitoring section 50 may also determine whether the signal is the diagnosis permit signal on the basis of the duty ratio of the High signal (inhibition signal) and the Low signal (permit signal) that are continuously outputted from the output circuit 61 of the determination section 60. That is, the determination may be made on the basis of any criterion as long as the stepped signal outputted from the output circuit 61 during normal operation and the signal of the stepped signal outputted from the output circuit 61 at the time of permitting the start of a self-diagnosis have different periods.

Modified Example 2

In the aforementioned embodiment, the monitoring section 50 outputs the answerback signal upon reception of the signal outputted from the determination section 60. However, the answerback signal can also be eliminated. In this case, for example, the signal outputted from the monitoring section 50 may be desirably filtered so that the signal contains no noise.

REFERENCE SIGNS LIST

10: assembled battery, 11: electric cell, 20: monitoring unit, 21: voltage detection circuit, 22: controller, 23: current sensor, 24: ECU (Electronic Control Unit), 31 to 33: system main relay, 34: limiter resistor, 35, 36 charging relay, 41: inverter, 42: motor generator, 43: AC charger, 50: monitoring section, 60: determination section, 61: output circuit, 70: electric storage device

The invention claimed is:

1. A monitoring system comprising:
a monitoring section that, in a normal mode, acquires information on a charge and discharge state of an electric storage device; and
a determination section that determines whether or not the charge and discharge state of the electric storage device falls within an allowable range on the basis of the information acquired by the monitoring section, wherein
the determination section has an output section continuously outputting, to the monitoring section, a stepped reference signal made up of a High signal and a Low signal when the monitoring section is in the normal mode, when the charge and discharge state of the electric storage device has been determined to fall within the allowable range and the monitoring section is in the normal mode, the determination section changes a period of the High and Low signals of the stepped reference signal to output a diagnosis permit signal, the diagnosis permit signal made up of unique High and Low signals that are set to execute a self-diagnosis for detecting an abnormal event in the monitoring section, and
the monitoring section determines whether or not the High and Low signals continuously received from the determination section coincide with the unique High and Low signals of the diagnosis permit signal,
the monitoring section stops an operation in the normal mode and executes the self-diagnosis when the High and Low signals continuously received from the determination section coincide with the unique High and Low signals of the diagnosis permit signal.

2. The monitoring system according to claim 1, wherein the determination section inhibits charge of the electric storage device when the electric storage device is charged, the charge and discharge state of the electric storage device has been determined to fall within the allowable range and the monitoring section executes the self-diagnosis.

3. The monitoring system according to claim 1, wherein the monitoring section outputs a signal received from the determination section as an answerback signal to the determination section; and
the determination section outputs the diagnosis permit signal again when the answerback signal in response to the diagnosis permit signal output to the monitoring section is different from the diagnosis permit signal.

4. A vehicle having the monitoring system as set forth in claim 1, wherein
the electric storage device supplies an electric power to a motor for running the vehicle and can be charged from a power supply external to the vehicle.

* * * * *